US009754658B2

(12) United States Patent
Kim et al.

(10) Patent No.: US 9,754,658 B2
(45) Date of Patent: Sep. 5, 2017

(54) MEMORY MODULE, MEMORY SYSTEM INCLUDING THE SAME, AND DATA STORAGE SYSTEM INCLUDING THE MEMORY MODULE

(71) Applicant: Samsung Electronics Co., Ltd., Suwon-si, Gyeonggi-do (KR)

(72) Inventors: Do Hyung Kim, Hwaseong-si (KR); In Young Park, Anyang-si (KR); Dong Yoon Seo, Seoul (KR); Jong Hyun Seok, Seoul (KR); Young Ho Lee, Seongnam-si (KR); Dong Min Jang, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/000,319

(22) Filed: Jan. 19, 2016

(65) Prior Publication Data

US 2016/0247552 A1    Aug. 25, 2016

(30) Foreign Application Priority Data

Feb. 23, 2015 (KR) ........................ 10-2015-0025271

(51) Int. Cl.
| | |
|---|---|
| *G11C 5/02* | (2006.01) |
| *G11C 11/4093* | (2006.01) |
| *G11C 5/04* | (2006.01) |
| *G11C 5/06* | (2006.01) |
| *G11C 7/02* | (2006.01) |
| *G11C 11/4076* | (2006.01) |

(52) U.S. Cl.
CPC ............ *G11C 11/4093* (2013.01); *G11C 5/04* (2013.01); *G11C 5/063* (2013.01); *G11C 7/02* (2013.01); *G11C 11/4076* (2013.01)

(58) Field of Classification Search
CPC ....... G11C 11/4093; G11C 5/04; G11C 5/063; G11C 7/02
See application file for complete search history.

(56) References Cited

U.S. PATENT DOCUMENTS

| | | | | |
|---|---|---|---|---|
| 5,513,135 | A * | 4/1996 | Dell .......................... | G11C 5/06 365/52 |
| 5,625,780 | A | 4/1997 | Hsieh et al. | |
| 5,841,686 | A | 11/1998 | Chu et al. | |
| 5,953,215 | A * | 9/1999 | Karabatsos ............ | H05K 1/029 361/736 |
| 7,012,812 | B2 | 3/2006 | Haba | |
| 7,385,281 | B2 | 6/2008 | Nishio et al. | |

(Continued)

FOREIGN PATENT DOCUMENTS

JP          2005531057 A      10/2005

*Primary Examiner* — Toan Le
(74) *Attorney, Agent, or Firm* — Harness, Dickey & Pierce, P.L.C.

(57) ABSTRACT

A memory module includes a first printed circuit board (PCB) which includes a first surface, a second surface, first taps formed on the first surface, and second taps formed on the second surface, a first buffer attached to the first PCB, and first memory devices attached to the first PCB, in which the first buffer is configured to transmit signals input through the first taps and the second taps to the first memory devices, and signals re-driven by the first buffer among the signals are transmitted to a second module through the second taps.

20 Claims, 13 Drawing Sheets

(56) References Cited

U.S. PATENT DOCUMENTS

| | | |
|---|---|---|
| 8,035,408 B1 | 10/2011 | Co |
| 8,081,474 B1 | 12/2011 | Zohni et al. |
| 8,199,515 B2 | 6/2012 | Bandholz et al. |
| 8,315,066 B2 | 11/2012 | Chen et al. |
| 8,369,099 B2 | 2/2013 | Kim et al. |
| 2002/0038405 A1* | 3/2002 | Leddige .............. G06F 13/4256 711/115 |
| 2002/0074458 A1* | 6/2002 | Laraway ................ B64G 1/222 244/172.6 |
| 2009/0129041 A1* | 5/2009 | Cho ....................... H05K 1/147 361/803 |
| 2012/0282803 A1 | 11/2012 | Augsburger et al. |
| 2016/0117101 A1* | 4/2016 | Choi ....................... G06F 3/061 711/103 |

\* cited by examiner

MEMORY MODULE, MEMORY SYSTEM INCLUDING THE SAME, AND DATA STORAGE SYSTEM INCLUDING THE MEMORY MODULE

CROSS-REFERENCE TO RELATED APPLICATION

This application claims priority under 35 U.S.C. §119(a) from Korean Patent Application No. 10-2015-0025271 filed on Feb. 23, 2015, the disclosure of which is hereby incorporated by reference in its entirety.

BACKGROUND

Embodiments of the present inventive concepts relate to a memory module, and more particularly to a memory module which can increase capacity of a memory module without performance deterioration by including a buffer for re-driving in the memory module, a memory system including the same, and/or a data storage system including the memory module.

High-definition and various graphic environments are in a computer environment such as a personal computer (PC), an engineering work station, or a server computer. Diverse and complex software makes the computer system have high-capacity, high-density, and high-performance. Accordingly, control signals of memory devices are to have fast speed and high performance, resulting in increasing the number of power pins for lowering signal noises.

An increase in the number of pins in the memory module increases an area of the memory module or the number of laminated layers, and makes it difficult to perform wiring design on a printed circuit board (PCB), thereby increasing in size of the computer system and causing a performance degradation of the computer system.

SUMMARY

An example embodiment of the present inventive concepts is directed to a memory module which includes a buffer for re-driving signals to another module, a memory system including the same, and/or a data storage system including the memory module.

An example embodiment of the present inventive concepts is directed to a memory module including a first module and a second module. The first module includes a first printed circuit board (PCB) which includes a first surface, a second surface, first taps formed on the first surface, and second taps formed on the second surface, a first buffer attached to the first PCB, and first memory devices attached to the first PCB, in which the first buffer is configure to transmit signals received through the first taps and the second taps to the first memory devices in a first operation mode, and to transmit signals re-driven by the first buffer among the signals to a second module through the second taps in a second operation mode.

The second module includes a second PCB which includes a third surface, a fourth surface, third taps that are formed on the third surface and receive the re-driven signals transmitted through the second taps, and fourth taps that are formed on the fourth surface, a second buffer attached to the second PCB, and second memory devices attached to the second PCB, and in which the second buffer is configure to transmit the re-driven signals received through the third taps to the second memory devices. The first PCB may be a rigid printed circuit board, and the second PCBs may be a flexible printed circuit board.

According to an example embodiment, the first buffer may be attached to the first surface or the second surface. The number of the second taps is more than the number of the fourth taps, and the number of the third taps is more than the number of fourth taps.

The signals may be synchronized with a clock signal transmitted from the first buffer to the first memory devices, and the re-driven signals may be synchronized with the clock signal transmitted from the second buffer to the second memory devices.

The first memory devices and the second memory devices may be dynamic random access memories. According to an example embodiment, the second buffer may be attached to the third surface or the fourth surface. The memory module may be embodied in a form of a single in-line memory module (SIMM) or a dual in-line memory module (DIMM).

The first module further includes a third buffer which is attached to the first PCB and is configure to transmit a clock signal to the first buffer and each of the first memory devices, and the second module further includes a fourth buffer which is attached to the second PCB and is configure to transmit the clock signal to the second buffer and each of the second memory devices.

An example embodiment of the present inventive concepts is directed to a memory system, including a mainboard, a slot mounted onto the mainboard, and a memory module, wherein the memory module comprises same elements disclosed in the previous embodiment.

An example embodiment of the present inventive concepts is directed to a data storage system, including a memory system and a controller which controls an operation of the memory system, in which the memory system includes a mainboard, a slot mounted onto the mainboard, and a memory module inserted into the slot, wherein the memory module comprises same elements disclosed in the previous embodiment. According to an example embodiment, the data storage system may be a data center or an internet data center.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
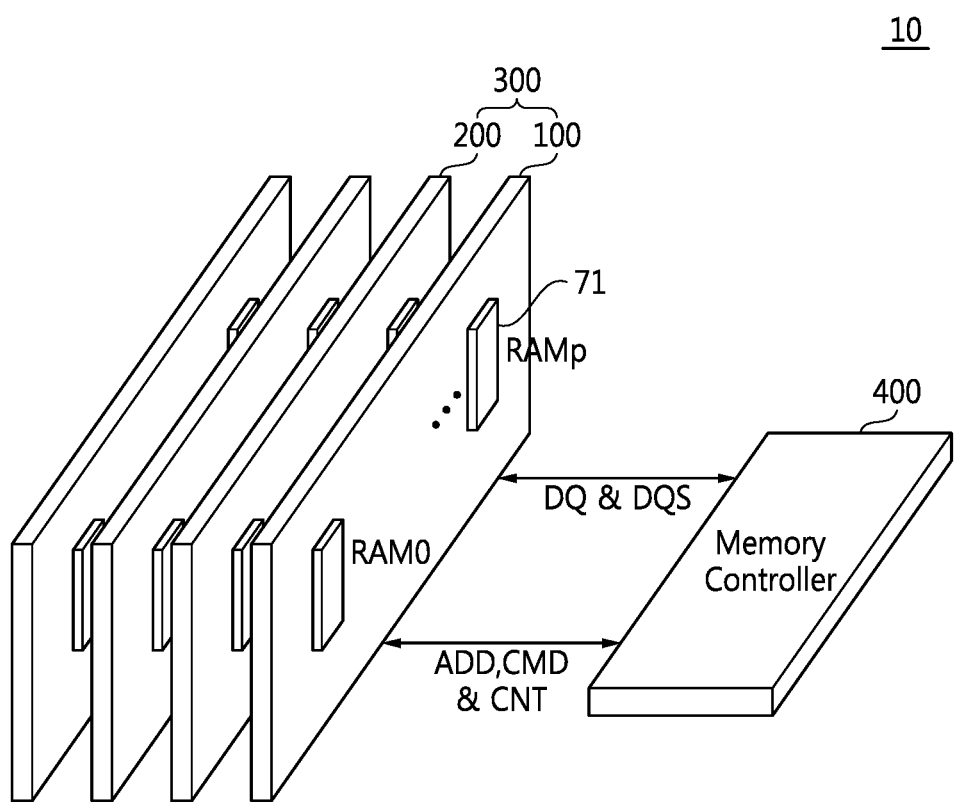
FIG. 1 is a block diagram of a data storage system according to an example embodiment of the present inventive concepts.

The present inventive concepts now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
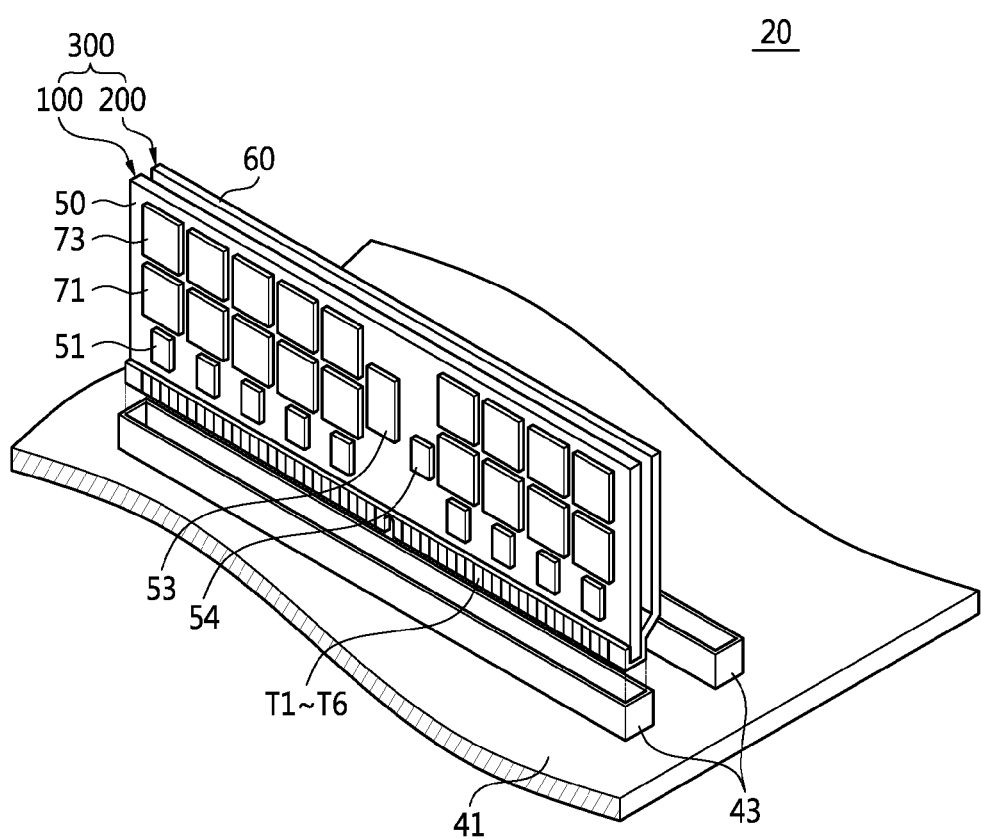
FIG. 2 is a perspective view which shows a portion of a memory system according to an example embodiment of the present inventive concepts.
Figure 3:
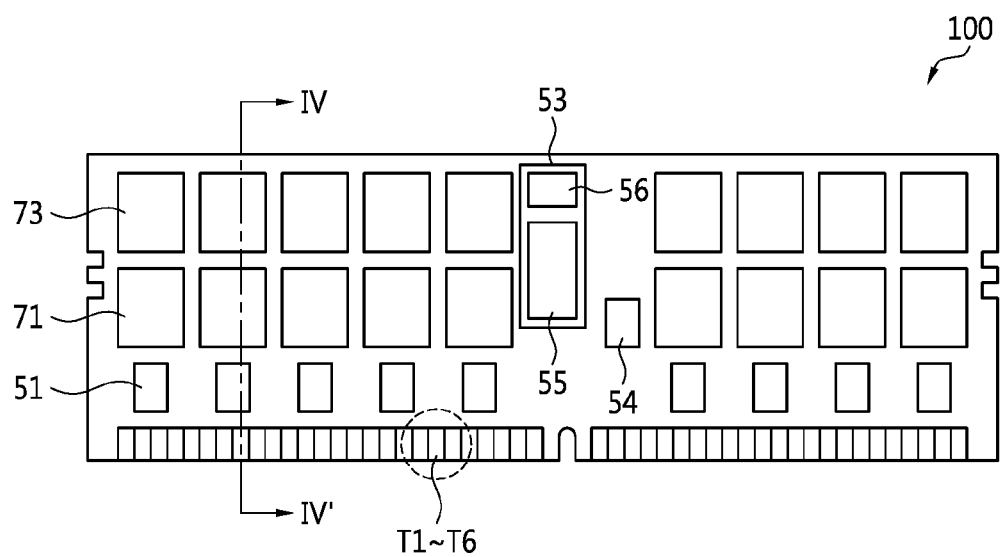
FIG. 3 is a plan view which shows one surface of a memory module shown in FIG. 2.

FIG. 1 is a block diagram of a data storage system according to an example embodiment of the present inventive concepts, FIG. 2 is a perspective view which shows a portion of a memory system according to an example embodiment of the present inventive concepts, and FIG. 3 is a plan view which shows one surface of a memory module shown in FIG. 2.

Referring to FIG. 1, a data storage system 10 may include a memory module 300 and a memory controller 400. The memory module 300 may include a first module 100 and a second module 200. Each of the first module 100 and the second module 200 may include a semiconductor memory device, e.g., dies RAM0 to RAMp. Each of the modules 100 and 200 may be embodied in a single in-line memory module (SIMM) or a dual in-line memory module (DIMM).

Each of the dies RAM0 to RAMp may operate in response to an address signal ADD, a command signal CMD, and/or a control signal CNT, which are output from the memory controller 400, and may transmit or receive a data signal DQ and a data strobe signal DQS to or from the memory controller 400.

The memory controller 400 may control memory operation such as read operation, write operation, or refresh operation, of the memory module 300. The memory controller 400 may be embodied in a portion of a system on chip (SoC).

Referring to FIGS. 1 to 3, a memory system 20 may include a mainboard 41, a memory module 300, and connectors 43. The connectors 43 may be attached to the mainboard 41, the connectors 43 may electrically connect the memory module 300 and the mainboard 41. The memory module 300 may be inserted into the connectors 43 to be electrically connected to the mainboard 41. The connectors 43 may be slots.

The first module 100 may include a rigid printed circuit board 50 and first memory devices 71 and 73. The first memory devices 71 and 73 may be attached to one surface or both surfaces of the rigid printed circuit board 50.

A first buffer 51, a memory buffer 53, and/or a logic chip 54 may be attached to the rigid printed circuit board 50. The first buffer 51 may transmit signals transmitted from taps T1 to T6 to each of the first memories 71 and 73. The signals may include at least one of a data signal DQ, a data strobe signal DQS, an address signal ADD, a command signal CMD, and a control signal CNT.

The memory buffer 53 may transmit the signals transmitted from taps T1 to T6 to each of the first memory devices 71 and 73. The signals may include at least one of the address signal ADD, the command signal CMD, the control signal CNT, and the clock signal CLK, which are output from the memory controller 400.

The memory buffer 53 may include a register 55 and a phase locked loop (PLL) circuit 56. According to an example embodiment, the PLL circuit 56 may be replaced with a delay locked loop (DLL) circuit. For example, the memory buffer 53 may store the address signal and/or the command signal CMD output from the memory controller 400 in the register 55, and supply a clock signal output from the PLL circuit 56 to the first buffer 51 and each of the first memory devices 71 and 73.

The second module 200 may include a flexible printed circuit board 60 and second memory devices. The second memory devices may be attached to one surface or both surfaces of the flexible printed circuit board 60.

The flexible printed circuit board 60 may include elements corresponding to elements 51, 53, and 54 included in the rigid printed circuit board 50. The flexible printed circuit board 60 may be bent or folded so as to be connected to the rigid printed circuit board 50. For example, a portion of the flexible printed circuit board 60 may be formed so as to surround one edge of the rigid printed circuit board 50. The taps T1 to T6 connected to the connectors 43 may be formed at one edge of the rigid printed circuit board 50 or the flexible printed circuit board 60.

The memory module 300 may receive the address signal ADD and the command signal CMD from the memory controller 400 through the taps T1 to T6. The memory module 300 may transmit or receive the data signal DQ and the data strobe signal DQS to or from the memory controller 400 through the taps T1 to T6.

The taps T1 to T6 may be embodied in copper (Cu), tungsten (W), tungsten nitride (WN), titanium (Ti), titanium nitride (TiN), tantalum (Ta), tantalum nitride (TaN), gold (Au), and/or a combination of these. For example, the taps T1 to T6 may include gold (Gu) with which a surface of the copper (Cu) is coated. The taps T1 to T6 may be electrically connected to the first memory devices 71 and 73, the first buffer 51, the memory buffer 53, and/or the logic chip 54 in a serial or parallel manner. The taps T1 to T6 may be electrically connected to memory devices attached to each of the modules 100 and 200. The taps T1 to T6 may be pins.

Figure 4:
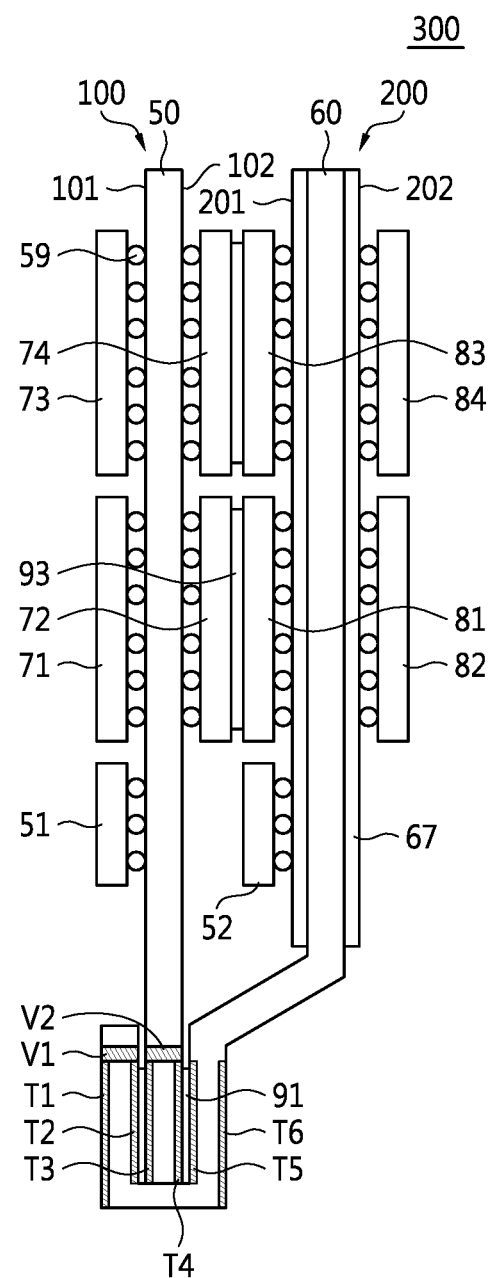
FIG. 4 is a cross-sectional view taken along line IV-IV' of FIG. 3 disclosing a structure of the memory module according to an example embodiment of the present inventive concepts.

FIG. 4 is a cross-sectional view taken along line IV-IV' of FIG. 3 so as to describe a structure of the memory module according to an example embodiment of the present inventive concepts. Referring to FIGS. 1 to 4, the first module 100 may include a first printed circuit board (PCB) 50, a first buffer 51 attached to the first PCB 50, and the first memory devices 71 to 74 attached to a first surface 101 and a second surface 102 of the first PCB 50.

The first PCB 50 may include first taps T3 formed on the first surface 101 and second taps T4 formed on the second surface 102. At this time, the first PCB 50 may be the rigid printed circuit board. The first PCB 50 includes first via plugs V2, and the first via plugs V2 may be connected to the first taps T3 and the second taps T4 via the first PCB 50.

The first buffer 51 may transmit signals received through the first taps T3 and the second taps T4 to at least one of the first memory devices 71 to 74. The signals re-driven by the first buffer 51 among the signals may be transmitted to the second module 200 through the second taps T4. The signals may include at least one of the data signal DQ, the address signal ADD, the command signal CMD, and the control signal CNT, which are output from the memory controller 400.

The first buffer 51 may be attached to the first PCB 50 through conductive contact means 59. For example, the conductive contact means 59 may be solder balls or bumps; however, it is not limited thereto. An example embodiment that the first buffer 51 is attached to the first surface 101 is shown in FIG. 4; however, the first buffer 51 may be attached to the second surface 102 according to an example embodiment.

Each of the first memory devices 71 to 74 may be attached to the first surface 101 and the second surface 102 of the first PCB 50 through the conductive contact means 59. For example, the conductive contact means 59 may be solder balls or bumps; however, it is not limited thereto.

The first memory devices 71 to 74 may be volatile memory devices or non-volatile memory devices. The volatile memory device may be a random access memory (RAM), a dynamic RAM (DRAM), a static RAM (STAM), a thyristor RAM (T-RAM), a zero capacitor RAM (Z-RAM), or a Twin Transistor RAM (TTRAM). For example, the first memory devices 71 to 74 may be DRAMs. The non-volatile memory device may be an Electrically Erasable Programmable Read-Only Memory (EEPROM), a flash memory, a Magnetic RAM (MRAM), a Spin-Transfer Torque MRAM, a Ferroelectric RAM (FeRAM), a Phase change RAM (PRAM), or a Resistive RAM (RRAM).

Each of the first memory devices 71 to 74 may be a semiconductor memory package. The semiconductor memory package may be a Package on Package (PoP), Ball Grid Arrays (BGAs), Chip Scale Packages (CSPs), a Plastic Leaded Chip Carrier (PLCC), a Plastic Dual In-Line Package (PDIP), a Chip On Board (COB), a CERamic Dual In-Line Package (CERDIP), a plastic metric quad flat pack (MQFP), a Thin Quad Flat Pack (TQFP), a small-outline integrated circuit (SOIC), a shrink small outline package (SSOP), a thin small outline (TSOP), a system in package (SIP), a multi chip package (MCP), a wafer-level package (WLP), or a wafer-level processed stack package (WSP).

The first module 100 may further include a third buffer 53 which is attached to the first PCB 50 and transmits a clock signal to the first buffer 51 and the first memory devices 71 to 74. The clock signal may be transmitted to the third buffer 53 from a clock buffer according to a control of the memory controller 400. The second module 200 may include the second PCB 60, a second buffer 52 attached to the second PCB 60, and second memory devices 81 to 84 attached to the second PCB 60. At this time, the second PCB 60 may be the flexible printed circuit board.

The second PCB 60 includes a third surface 201, a fourth surface 202, third taps T5 which are formed on the third surface 201 and receive re-driven signals transmitted through the second taps T4, and fourth taps T6 which are formed on the fourth surface 202. The second PCB 60 may include a fifth surface 203, a sixth surface 204, fifth taps T1 which are formed on the fifth surface 203, and sixth taps T2 which are formed on the sixth surface 204. The second PCB 60 may include second via plugs V1, and the second via plugs V1 may connect the fifth taps T1 and the sixth taps T2 via the second PCB 60.

The second buffer 52 may transmit signals which are received through the third taps T5 and are re-driven by the first buffer 51 to at least one of the second memory devices 81 to 84. The second buffer 52 may be attached to the second PCB 60 through the conductive contact means 59. The second buffer 52 may be attached to the third surface 201 or the fourth surface 202.

According to an example embodiment, the number of the first taps T3 may be the same as or different from the number of the fourth taps T6, and the number of the second taps T4 may be the same as or different from the number of the third taps T5. The number of the second taps T4 may be more than the number of the first taps T3 or the number of the fourth taps T6, and the number of the third taps T5 may be more than the number of the first taps T3 or the number of the fourth taps T6.

Each of the second memory devices 81 to 84 may be attached to the second PCB 60 through the conductive contact means 59. Each of the second memory devices 81 to 84 may be a volatile memory device or a non-volatile memory device. The second memory devices 81 to 84 may be DRAMs. The second module 200 may further include a fourth buffer (not shown) which is attached to the second PCB 60 and transmits a clock signal to the second buffer 52 and the second memory devices 81 to 84. The clock signal may be transmitted to the fourth buffer from a clock buffer (not shown) according to a control of the memory controller 400.

The memory module 300 may further include a conductive contact material 91 formed between the second taps T4 and the third taps T5. Moreover, the memory module 300 may further include the conductive contact material 91 formed between the sixth taps T2 and the first taps T3. The first PCB 50 and the second PCB 60 may be in contact with each other through the conductive contact material 91. For example, the conductive contact material 91 may be an anisotropic conductive film (ACF) or an anisotropic conductive paste (ACP); however, it is not limited thereto.

According to an example embodiment, the second module 200 may further include each of auxiliary substrates 67 attached to the third surface 201 and the fourth surface 202 of the second PCB 60. The auxiliary substrates 67 are attached to both surfaces 201 and 202 of the second PCB 60, and thereby flexible characteristics of the second PCB 60 can be lessened. At this time, the auxiliary substrates 67 may be formed of a prepreg and a copper foil (Cu foil).

When the auxiliary substrates 67 are attached to the both surfaces 201 and 202 of the second PCB 60, a portion of the second PCB 60 to which the auxiliary substrates 67 are attached may perform a function of the rigid printed circuit board. At this time, the other portions of the second PCB 60 to which the auxiliary substrates 67 are not attached have the flexible characteristics. According to another example embodiment, the auxiliary substrates 67 may not be attached to the second PCB 60.

The memory module 300 may further include an adhesive material 93 which is formed between some 72 and 74 of the first memory devices 71 to 74 and some 81 and 83 of the second memory devices 81 to 84. For example, the adhesive material 93 may be an adhesive tape which has a function of a heat sink.

Signals to the first buffer 51 may be synchronized with a specific clock signal to be transmitted to at least one of the first memory devices 71 to 74 from the first buffer 51, and the signals re-driven by the first buffer 51 may be synchronized with the specific clock signal to be transmitted to at least one of the second memory devices 81 to 84 from the second buffer 52.

Figure 5:
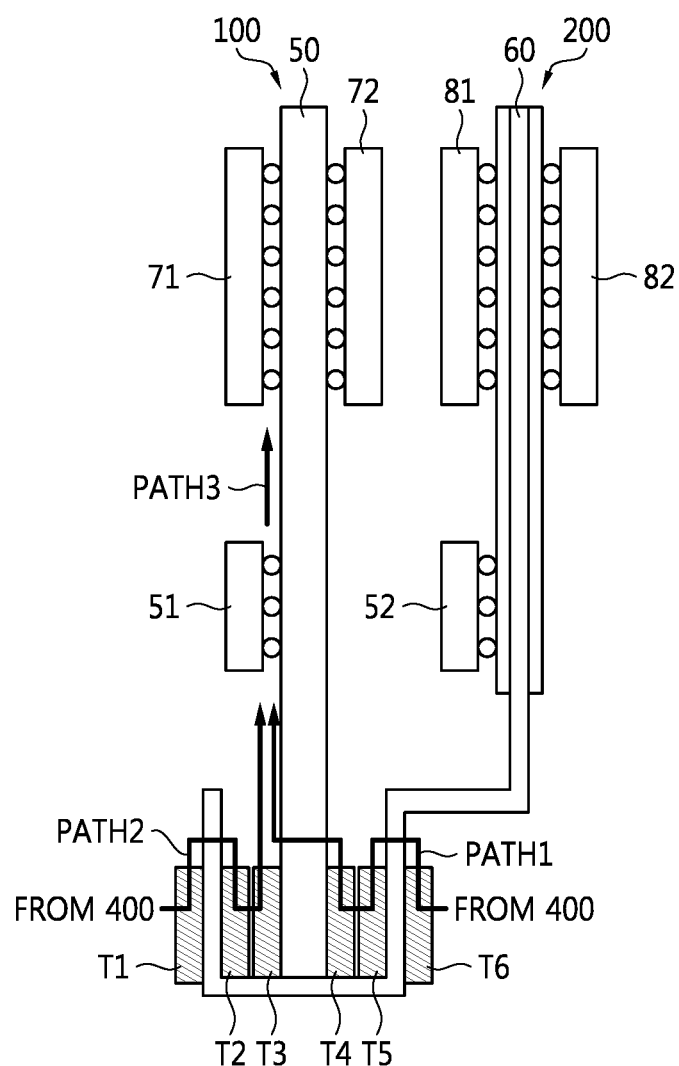
FIG. 5 is a diagram describing that a first buffer shown in FIG. 4 receives signals through taps.
Figure 6:
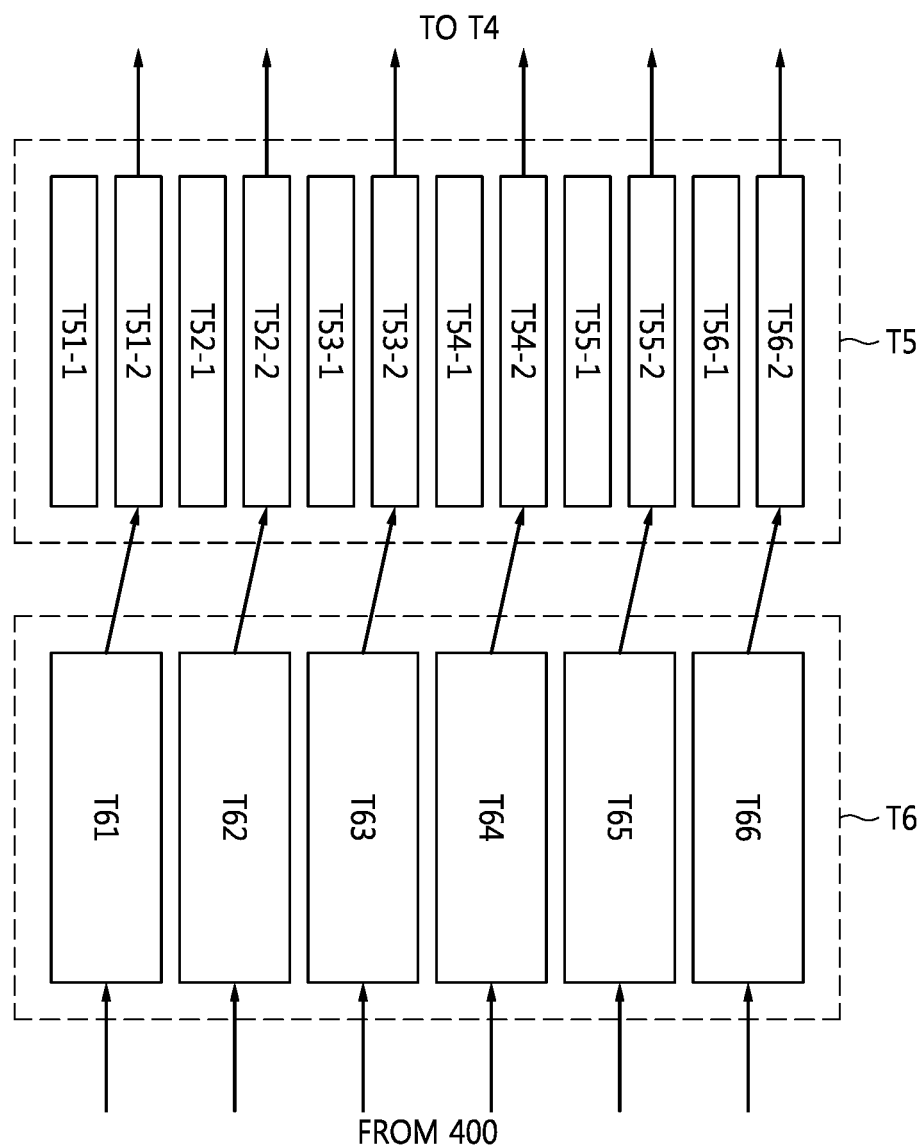
FIG. 6 is an example embodiment of third taps and fourth taps of FIG. 5.
Figure 7:
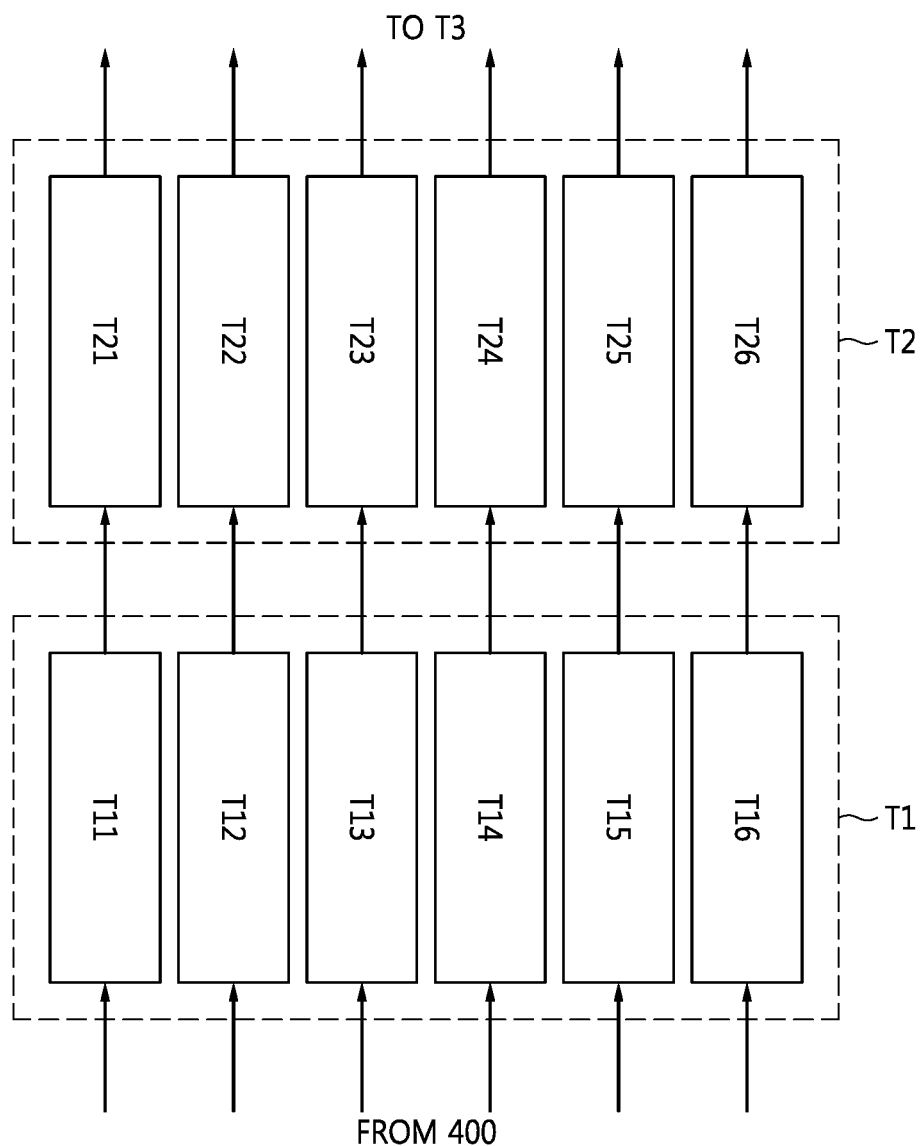
FIG. 7 is an example embodiment of fifth taps and sixth taps of FIG. 5.
Figure 8:
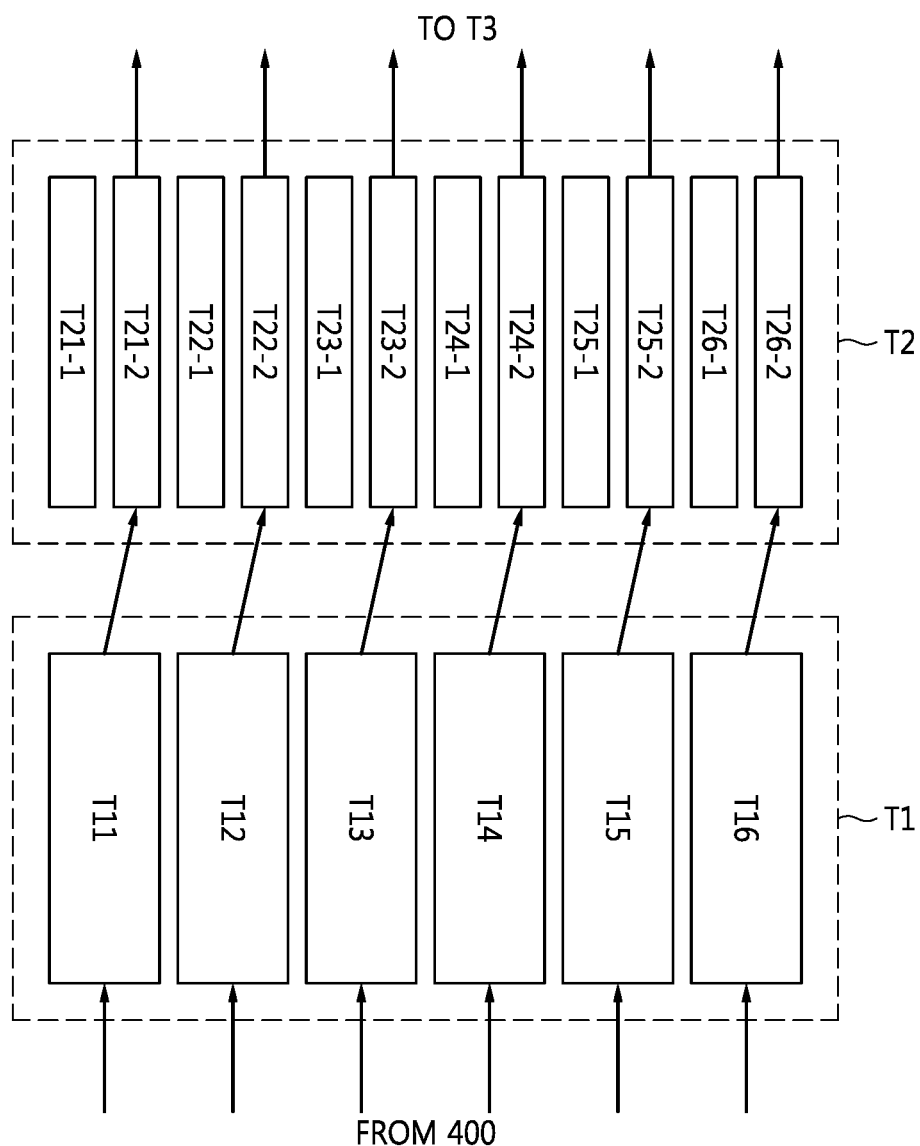
FIG. 8 is another example embodiment of fifth taps and sixth taps of FIG. 5.

FIG. 5 is a diagram which describes a process that a first buffer shown in FIG. 4 receives signals through taps, FIG. 6 is an example embodiment of third taps and fourth taps in the process shown in FIG. 5, FIG. 7 is an example embodiment of fifth taps and sixth taps in the process shown in FIG. 5, and FIG. 8 is an example embodiment of fifth taps and sixth taps of FIG. 5. Referring to FIGS. 1 to 5, the first buffer 51 included in the first module 100 may receive the signals DQ, ADD, CMD, and/or CNT transmitted from the memory controller 400 through the taps T1 to T6.

Referring to FIG. 5, a path of signals is shown outside the first PCB 50 or the second PCB 60. However, the signals may be transmitted to the first buffer 51 and the first memory devices 71 and 72 through the inside of the first PCB 50 or the second PCB 60.

The signals DQ, ADD, CMD, and/or CNT may be transmitted to the first buffer 51 sequentially through the fourth taps T6, the third taps T5, and the second taps T4 in the first path PATH1.

Referring to FIGS. 1 to 6, it is assumed that the fourth taps T6 are composed of six taps T61 to T66, and the third taps T5 are composed of twelve taps T51-1 to T56-2. Each of the fourth taps T6 may transmit the signals DQ, ADD, CMD, and/or CNT transmitted from the memory controller 400 to each of corresponding taps T51-2 to T56-2 among the third taps T5.

In this example embodiment, T5 includes six taps T51-1 to T56-1 for transmitting the signals re-driven by the first buffer 51 to the second buffer 52, and six taps T51-2 to T56-2 for transmitting signals transmitted from the fourth taps T6 to the second taps T4.

Though the example embodiment discloses that fourth taps T6 include six taps T61 to T66 and the third taps T5 include twelve taps T51-1 to T56-2, the present inventive concepts are not limited thereto, and the number of the third taps T5 and/or the number of the fourth taps T6 may be variously changed according to a design specification. Referring to a second path PATH2, the signals DQ, ADD, CMD, and/or CNT may be transmitted to the first buffer 51 sequentially through the fifth taps T1, the sixth taps T2, and the first taps T3.

Referring to FIGS. 1 to 7, the fifth taps T1 are composed of six taps T11 to T16, and the sixth taps T2 are composed of six taps T21 to T26.

Each of the fifth taps T1 may transmit the signals DQ, ADD, CMD, and/or CNT transmitted from the memory controller 400 to each of the sixth taps T2. Each of the sixth taps T2 may transmit signals transmitted from each of the fifth taps T1 to the first taps T3.

Though the example embodiment discloses that fifth taps T1 include six taps T11 to T16, and the sixth taps T2 include six taps T21 to T26, the present inventive concepts are not limited thereto, and the number of the fifth taps T1 and/or the number of the sixth taps T2 may be variously changed according to a design specification.

Referring to FIGS. 1 to 8, the fifth taps T1 include six taps T11 to T16, and the sixth taps T2 include twelve taps T21-1 to T26-2. Each of the fifth taps T1 may transmit the signals DQ, ADD, CMD, and/or CNT transmitted from the memory controller 400 to each of corresponding taps T21-2 to T26-2 among the sixth taps T2.

It is assumed that the sixth taps T2 include six taps T21-1 to T26-1 for transmitting the signals re-driven by the first buffer 51 to the second buffer 52, and six taps T21-2 to T26-2 for transmitting signals transmitted from the fifth taps T1 to the first taps T3.

Signals transmitted to the first buffer 51 through the first path PATH1 and/or the second path PATH2 may be transmitted to at least one of the first memory devices 71 and 72 from the first buffer 51 along a third path PATH3.

Figure 9:
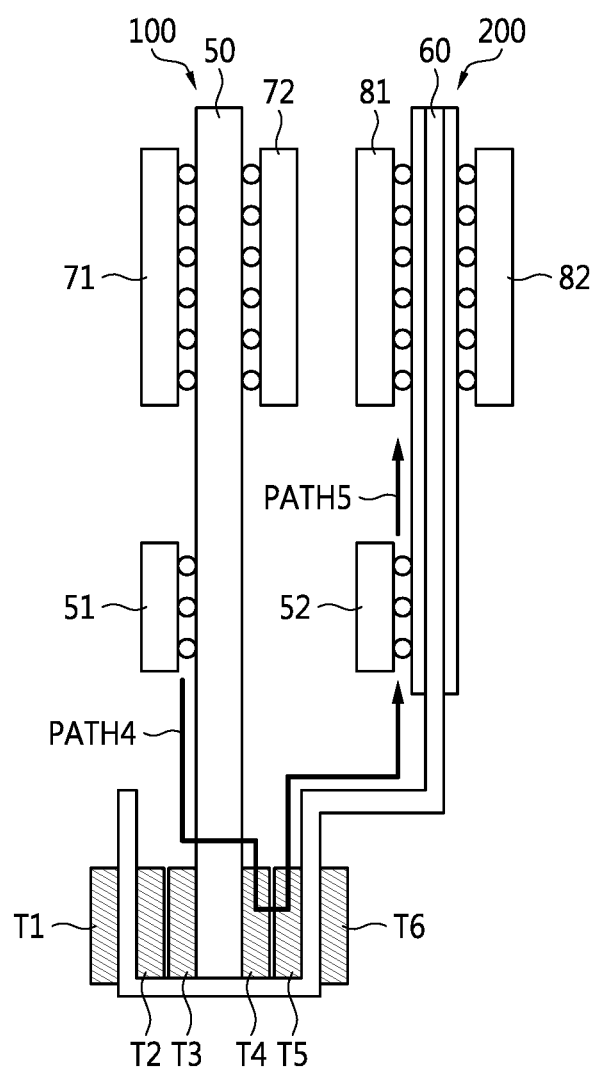
FIG. 9 is a diagram which describing that a first buffer of FIG. 4 transmits re-driven signals to a second buffer through taps.
Figure 10:
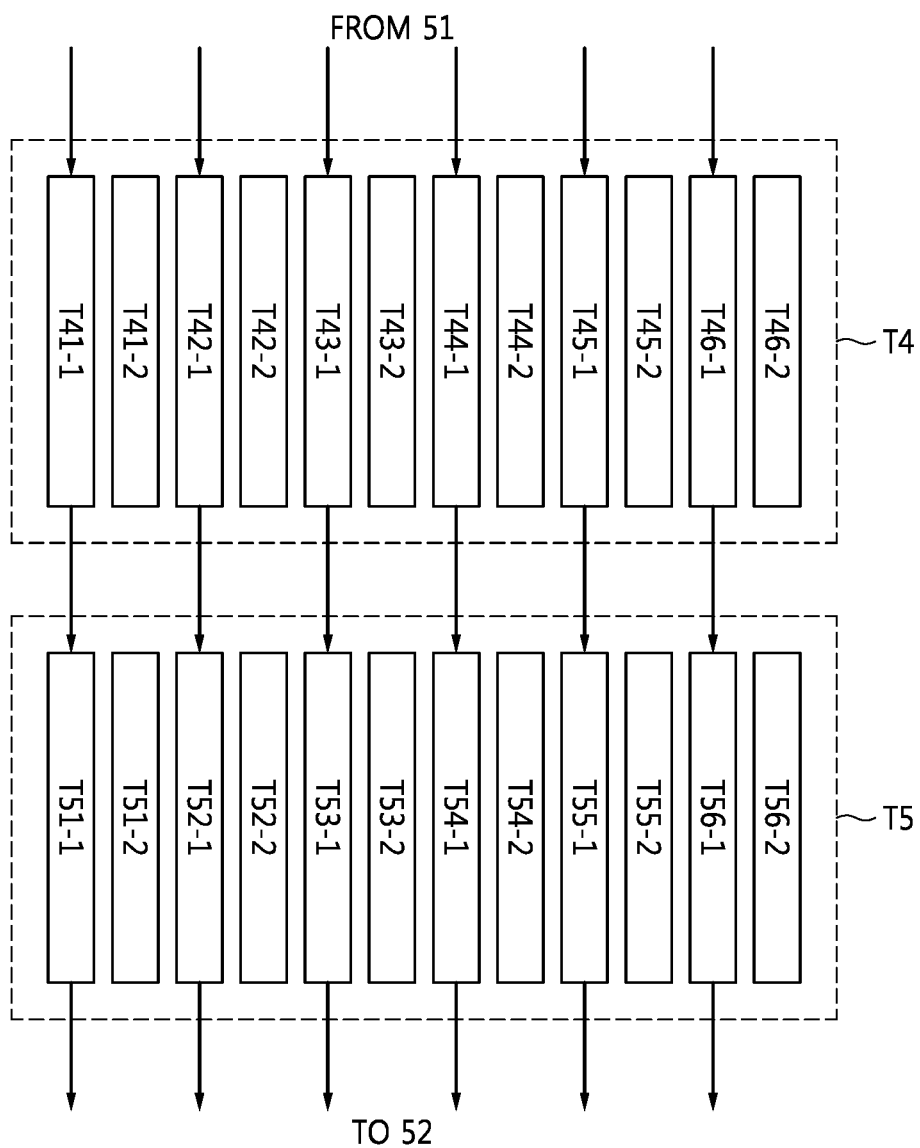
FIG. 10 shows an example embodiment of second taps and third taps of FIG. 9.

FIG. 9 is a diagram which describes that the first buffer of FIG. 4 transmits the re-driven signals to the second buffer through taps, and FIG. 10 shows an example embodiment of the second taps and the third taps of FIG. 9. Referring to FIGS. 1 to 9, the first buffer 51 included in the first module 100 may transmit the signals re-driven by the first buffer 51 to the second buffer 52 included in the second module 200 Referring to FIG. 9, a path of signals is shown outside the first PCB 50 or the second PCB 60, but the signals may be transmitted to the first buffer 51, the second buffer 52, and the second memory devices 81 and 82 through the inside of the first PCB 50 or the second PCB 60. The re-driven signals may be transmitted to the second buffer 52 from the first buffer 51 sequentially through the second taps T4 and the third taps T5 along the fourth path PATH4. The second buffer 52 may transmit the re-driven signals to at least one of the second memory devices 81 and 82 along the fifth path PATH5.

Referring to FIGS. 1 to 10, it is assumed that the second taps T4 include twelve taps T41-1 to T46-2 and the third taps T5 include twelve taps T51-1 to T56-2. Each of corresponding taps T41-1 to T46-1 among the second taps T4 may transmit the signals re-driven by the first buffer 51 to each of corresponding taps T51-1 to T56-1 among the third taps T5.

It is assumed that the second taps T4 include six taps T41-1 to T46-1 for transmitting the signals re-driven by the first buffer 51 to the third taps T5 and six taps T41-2 to T46-2 for transmitting signals transmitted from the third taps T5 to the first buffer 51. The third taps T5 include six taps T51-1 to T56-1 for transmitting signals transmitted from the second taps T4 to the second buffer 52 and six taps T51-2 to T56-2 for transmitting signals transmitted from the fourth taps T6 to the second taps T4.

Though the example embodiment discloses that the second taps T4 include twelve taps T41-1 to T46-2 and the third taps T5 include twelve taps T51-1 to T56-2, the present inventive concepts are not limited thereto, and the number of the third taps T5 and/or the number of the second taps T4 may be variously changed according to a design specification.

Figure 11:
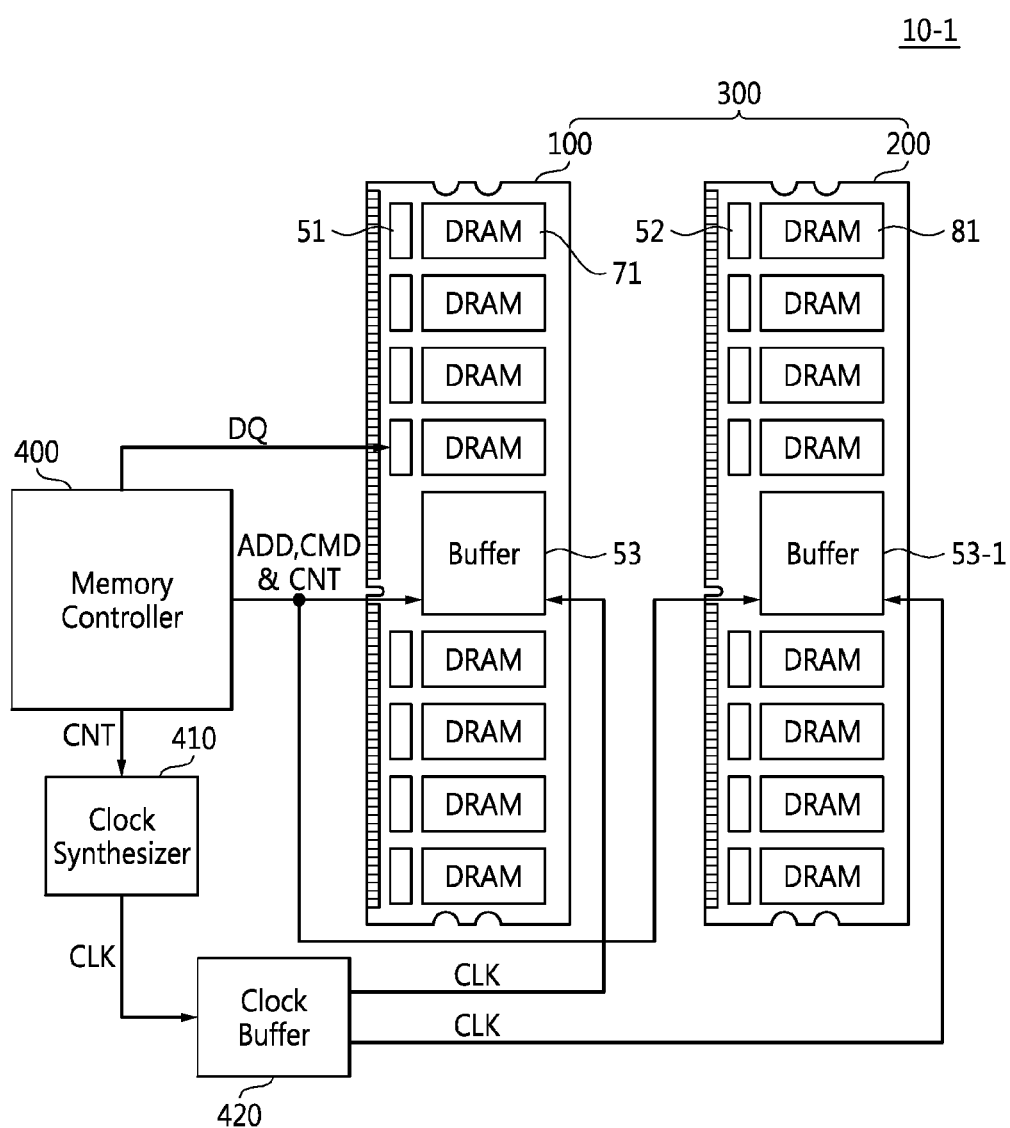
FIG. 11 is a block diagram of the data storage system according to an example embodiment of the present inventive concepts.

FIG. 11 is a block diagram of the data storage system according to another example embodiment of the present inventive concepts. Referring to FIGS. 1 to 11, a data storage system 10-1 may include a memory module 300, a memory controller 400, a clock synthesizer 410, and a clock buffer 420.

The memory module 300 includes the first module 100 and the second module 200, and each of the first module 100 and the second module 200 are substantially the same as or similar to the first module 100 and the second module 200 described referring to FIGS. 1 to 10 in structure and operation.

The first module 100 may include the first buffer 51, a third buffer 53, and a first DRAM 71, and the second module 200 may include the second buffer 52, a fourth buffer 53-1, and a plurality of second DRAM 81. The first buffer 51 may receive at least one of a data signal DQ and a data strobe signal DQS from the memory controller 400 through the taps T1 to T6, and the third buffer 53 may receive at least one of the address signal ADD, the command signal CMD, and the control signal CNT from the memory controller 400 through the taps T1 to T6.

The first buffer 51 may transmit the signals DQ and/or DQS received from the memory controller 400 to the first DRAM 71 through taps attached to the first PCB 50, and re-drive some of the signals DQ and/or DQS. The second buffer 52 may receive the signals re-driven by the first buffer 51 through the taps attached to the second PCB 60, and transmit the re-driven signals to the second DRAM 81.

The third buffer 53 may transmit the signals ADD, CMD, and/or CNT received from the memory controller 400 to the first DRAM 71 through the taps attached to the first PCB 50, and re-drive some of the received signals ADD, CMD, and/or CNT. The fourth buffer 53-1 may receive signals re-driven by the third buffer 53 through the taps attached to the second PCB 60 and transmit the re-driven signals to the second DRAM 81.

The third buffer 53 may re-drive some of the signals ADD, CMD, and/or CNT in the same manner as the first buffer 51 described in FIGS. 4 to 10 or through substantially the same process as the manner, and the fourth buffer 53-1 may process the signal re-driven by the third buffer 53 in the same manner as the second buffer 52 described in FIGS. 4 to 10 or through substantially the same process as the manner. According to an example embodiment, the third buffer 53 may transmit a clock signal received from the memory controller 400 through the taps attached to the first PCB 50, and re-drive the clock signal. The fourth buffer 53-1 may receive the clock signal re-driven by the third buffer 53 through the taps attached to the second PCB 60, and transmit the re-driven clock signal to the second DRAM 81.

The third buffer 53 may receive a clock signal CLK from the clock buffer 420, and transmit the clock signal CLK to each of the first buffer 51 and the first DRAM 71. The fourth buffer 53-1 may receive the clock signal CLK from the clock buffer 420, and transmit the clock signal CLK to each of the second buffer 52 and the second DRAM 81. The signals input into the first buffer 51 may be synchronized with the clock signal CLK to be transmitted to the first DRAM 71 from the first buffer 51, and the signals re-driven by the first buffer 51 may be synchronized with the clock signal CLK to be transmitted to the second DRAM 81 from the second buffer 52.

A clock synthesizer 410 may generate a clock signal CLK according to a control signal CNT output from the memory controller 400. The clock buffer 420 may buffer the clock signal CLK generated by the clock synthesizer 410, and transmit a buffered clock signal to each of the third buffer 53 and the fourth buffer 53-1.

Figure 12:
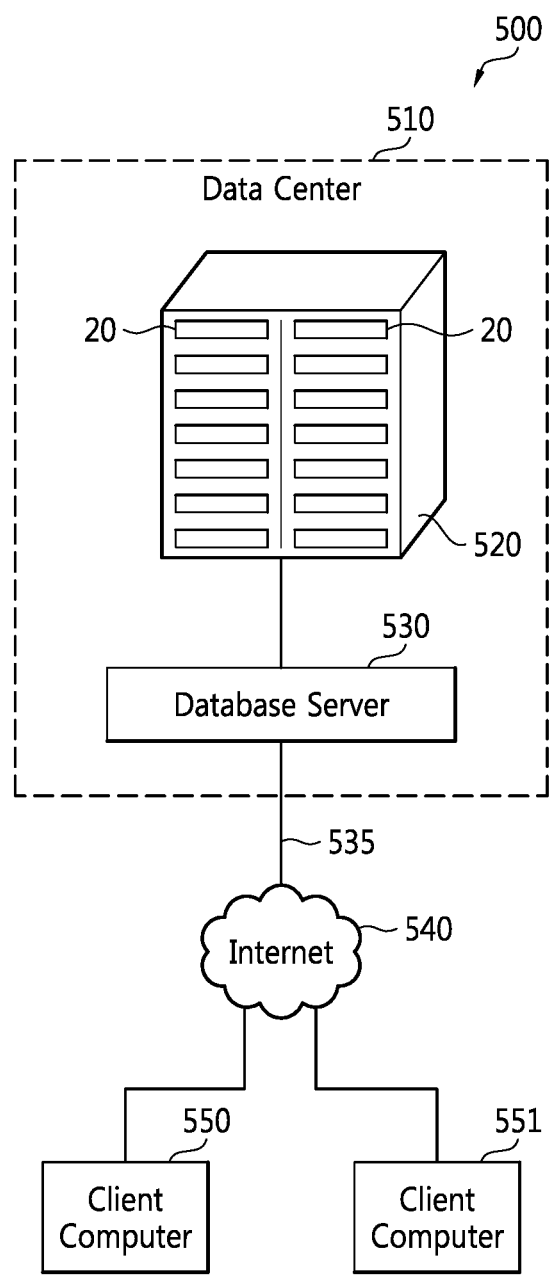
FIG. 12 is a block diagram of a data storage system according to an example embodiment of the present inventive concepts.

FIG. 12 is a block diagram of the data storage system according to still another example embodiment of the present inventive concepts. Referring to FIGS. 1 to 12, a data storage system 500 may include a data center 510, an internet network 540, and a plurality of client computers 550 and 551. The data center, internet data center, or cloud data center 510 may include the database 520 and a database server 530.

The database 520 may include a plurality of data storage devices 20. The plurality of data storage devices 20 may be installed in a rack. A structure and an operation of each of the data storage devices 20 are substantially the same as or similar to a structure and an operation of the memory system 20 including the memory module 300 described referring to FIGS. 1 to 10.

The database server 530 may control an operation of each of the plurality of data storage devices 20. The database server 530 may be connected to the internet network 540, e.g., the internet, through a first network, e.g., Local Area Network (LAN). Each of the plurality of client computers 550 and 551 may be connected to the database server 530 through the internet network 540.

Figure 13:
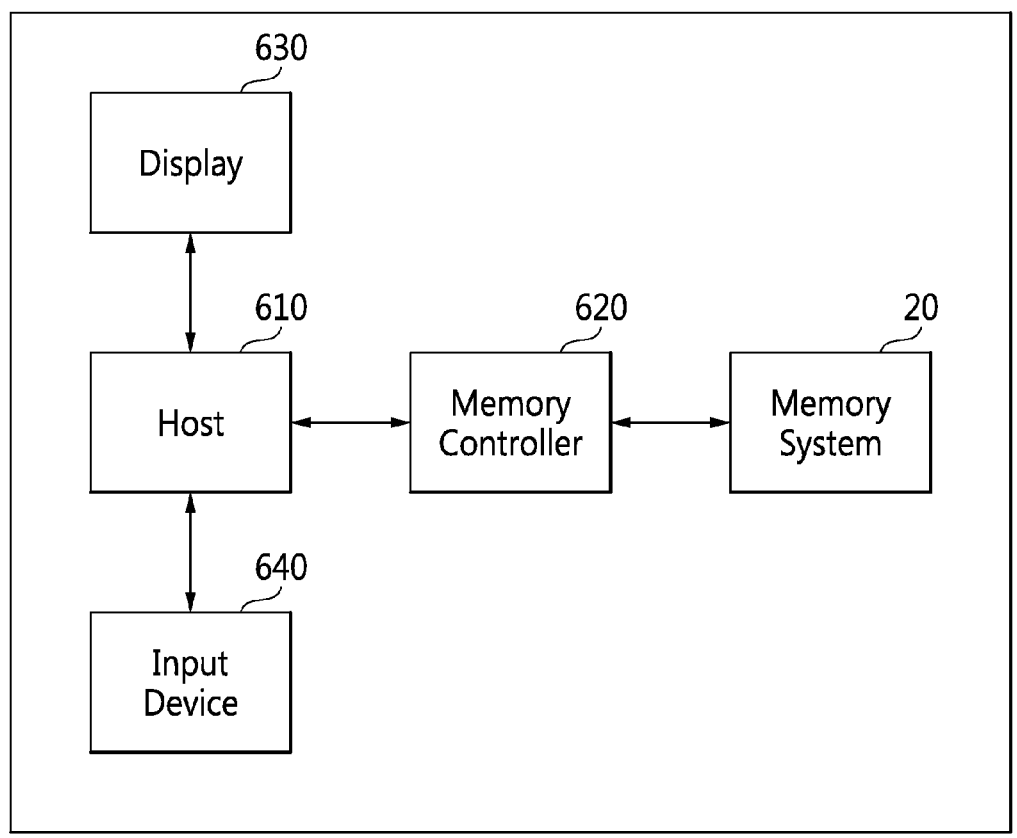
FIG. 13 is a block diagram of a data storage system according to an example embodiment of the present inventive concepts.

FIG. 13 is a block diagram of the data storage system according to still another example embodiment of the present inventive concepts. Referring to FIGS. 1 to 13, a data storage system 600 including the memory system 20 shown in FIG. 2 may be embodied in a personal computer (PC), or a network server. The data storage system 600 may include a host 610, the memory system 20, a memory controller 620 which controls a data processing operation of the memory system 20, a display 630, and an input device 640.

The host 610 may display data stored in the memory system 20 on the display 630 according to data input through the input device 640.

For example, the input device 640 may be embodied in a point device such as a touch pad or a computer mouse, a keypad, or a keyboard. The host 610 may control an entire operation of the data storage system 600, and control an operation of the memory controller 620. The memory controller 620 may be the memory controller 400 shown in FIG. 1.

The memory controller 620 which controls an operation of the memory system 20 according to an example embodiment may be embodied in a portion of the host 610 or in a separate chip from the host 610.

A memory module according to an example embodiment of the present inventive concepts may embody a buffer which re-drives signals to be transmitted to another module in the memory module, and increase capacity of the memory module without performance deterioration. The memory module according to an example embodiment of the present inventive concepts may embody the memory module which has high density without changing a design of a memory system.

Although a few embodiments of the present general inventive concepts have been shown and described, it will be appreciated by those skilled in the art that changes may be made in these embodiments without departing from the principles and spirit of the general inventive concepts, the scope of which is defined in the appended claims and their equivalents.

What is claimed is:

1. A memory module structure inserted into a slot, the memory module structure comprising a first module and a second module, wherein
the first module includes,
a first printed circuit board (PCB) including a first surface, a second surface, first taps on the first surface, and second taps on the second surface,
a first buffer attached to the first PCB, and
first memory devices attached to the first PCB, and
the first buffer is configured to,
transmit signals received through the first taps and the second taps to the first memory devices in a first operation mode, and
transmit at least one of the signals re-driven by the first buffer to the second module through the second taps in a second operation mode.

2. The memory module structure of claim 1, wherein the second module includes,
a second PCB including a third surface, a fourth surface, third taps, and fourth taps, the third taps on the third surface and configured to receive the re-driven signals transmitted through the second taps, the fourth taps on the fourth surface,
a second buffer attached to the second PCB, and
second memory devices attached to the second PCB, and
the second buffer is configured to transmit the re-driven signals received through the third taps to the second memory devices.

3. The memory module structure of claim 2, wherein the first PCB is a rigid printed circuit board, and the second PCB is a flexible printed circuit board.

4. The memory module structure of claim 2, wherein a number of the second taps is more than a number of the fourth taps, and a number of the third taps is more than the number of the fourth taps.

5. The memory module structure of claim 2, wherein the signals are synchronized with a clock signal to be transmitted to the first memory devices from the first buffer, and the re-driven signals are synchronized with the clock signal to be transmitted to the second memory devices from the second buffer.

6. The memory module structure of claim 2, wherein the first memory devices and the second memory devices are dynamic random access memories (DRAMs).

7. The memory module structure of claim 1, wherein the first buffer is attached to one of the first surface and the second surface.

8. The memory module structure of claim 2, wherein the second buffer is attached to one of the third surface and the fourth surface.

9. The memory module structure of claim 2, wherein the first module further includes a third buffer, the third buffer attached to the first PCB and configured to transmit a clock signal to the first buffer and each of the first memory devices, and
the second module further includes a memory buffer, the memory buffer attached to the second PCB and configured to transmit the clock signal to the second buffer and each of the second memory devices.

10. The memory module structure of claim 1, wherein the memory module structure is embodied in a form of a single in-line memory module (SIMM) or a dual in-line memory module (DIMM).

11. The memory module structure of claim 1,
wherein the first buffer is between a first area including the first memory devices and a second area including the first taps and the second taps.

12. A memory system comprising:
a mainboard;
a slot mounted onto the mainboard; and
a memory module structure inserted into the slot, the memory module structure including a first module and a second module, the first module including,
a first printed circuit board (PCB) including a first surface, a second surface, first taps on the first surface, and second taps on the second surface,
a first buffer attached to the first PCB, and
first memory devices attached to the first PCB, and
wherein the first buffer is configured to,
transmit signals received through the first taps and the second taps to the first memory devices in a first operation mode, and
transmit at least one of the signals re-driven by the first buffer to the second module through the second taps in a second operation mode.

13. The memory system of claim 12, wherein
the second module includes,
a second PCB including a third surface, a fourth surface, third taps, and fourth taps, the third taps on the third surface and configured to receive the re-driven signals transmitted through the second taps, the fourth taps on the fourth surface,
a second buffer attached to the second PCB, and
second memory devices attached to the second PCB, and
the second buffer is configured to transmit the re-driven signals received through the third taps to the second memory devices.

14. The memory system of claim 13, wherein the signals are synchronized with a clock signal to be transmitted to the first memory devices from the first buffer, and the re-driven signals are synchronized with the clock signal to be transmitted to the second memory devices from the second buffer.

15. The memory system of claim 13, wherein the first buffer is attached to one of the first surface and the second surface, and the second buffer is attached to one of the third surface and the fourth surface.

16. The memory system of claim 13, wherein a number of the second taps is more than a number of the fourth taps, and a number of the third taps is more than the number of the fourth taps.

17. A data storage system comprising:
a memory system; and a controller configured to control an operation of the memory system,
wherein the memory system includes,
   a mainboard,
   a slot mounted onto the mainboard, and
   a memory module structure inserted into the slot, the memory module structure including a first module and a second module, the first module including,
      a first printed circuit board (PCB) including a first surface, a second surface, first taps on the first surface, and second taps on the second surface,
      a first buffer attached to the first PCB, and
      first memory devices attached to the first PCB, and
wherein the first buffer is configured to,
   transmit signals received through the first taps and the second taps to the first memory devices in a first operation mode, and
   transmit at least one of the signals re-driven by the first buffer to the second module through the second taps in a second operation mode.

18. The data storage system of claim 17, wherein the data storage system is a data center or an internet data center.

19. The data storage system of claim 17, wherein
the second module includes,
   a second PCB including a third surface, a fourth surface, third taps, and fourth taps, the third taps on the third surface and configured to receive the re-driven signals transmitted through the second taps, the fourth taps on the fourth surface
   a second buffer attached to the second PCB and
   second memory devices attached to the second PCB, and
wherein the second buffer is configured to transmit the re-driven signals received through the third taps to the second memory devices.

20. The data storage system of claim 19, wherein a number of the second taps is more than a number of the fourth taps, and a number of the third taps is more than the number of the fourth taps.

* * * * *